United States Patent

Hsia et al.

[11] Patent Number: 5,851,898
[45] Date of Patent: Dec. 22, 1998

[54] METHOD OF FORMING STACKED CAPACITOR HAVING CORRUGATED SIDE-WALL STRUCTURE

[75] Inventors: Liang-Choo Hsia, Taipei; Thomas Chang, Hsin-Chu, both of Taiwan

[73] Assignee: Mosel Vitelic, Inc., Hsinchu, Taiwan

[21] Appl. No.: 697,442

[22] Filed: Aug. 23, 1996

[51] Int. Cl.⁶ .................................................. H01L 21/70
[52] U.S. Cl. ........................ 438/398; 438/396; 438/397; 438/253; 438/255; 361/321.4; 361/321.5
[58] Field of Search ...................... 219/121.36, 121.39, 219/121.4, 121.41; 437/47, 52, 60, 919; 29/25.42; 438/190, 197, 238–242, 253–256, 294, 297, 396–399, 381, 689, 694, 706–710; 361/311–322

[56] References Cited

U.S. PATENT DOCUMENTS 5,110,752  5/1992  Lu ............................................ 437/47
5,494,841  2/1996  Dennison et al. ......................... 437/52

*Primary Examiner*—Bot L. Ledynh
*Attorney, Agent, or Firm*—Tung & Associates

[57] ABSTRACT

A method of forming a capacitor that has improved charge storage capability and a capacitor produced by such method are provided. The method utilizes an additional layer of oxide spacer consisting of a plurality of oxide layers deposited by two alternating methods of thermal CVD and plasma CVD. After a contact hole is first etched by a plasma etching technique, the hole is again etched by an etchant such as hydrogen fluoride which has a high selectivity toward oxide layers formed by the plasma CVD method and a low selectivity toward oxide layers formed by the thermal CVD method. As a result, a corrugated side-wall of the contact hole is formed which affords the capacitor cell with a substantially increased surface area leading to an improved charge storage capability.

12 Claims, 1 Drawing Sheet

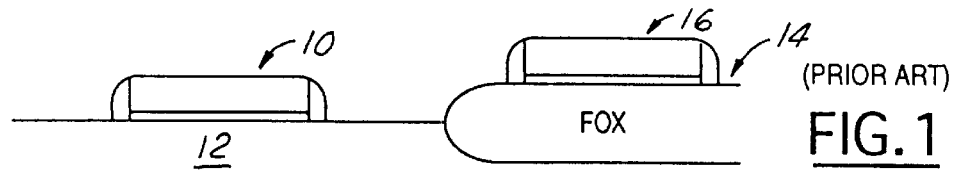
(PRIOR ART) FIG. 1
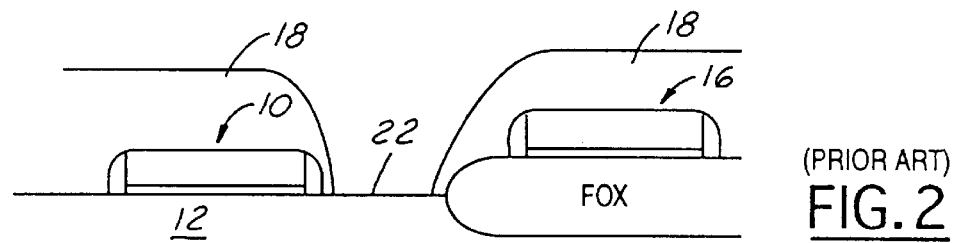
(PRIOR ART) FIG. 2
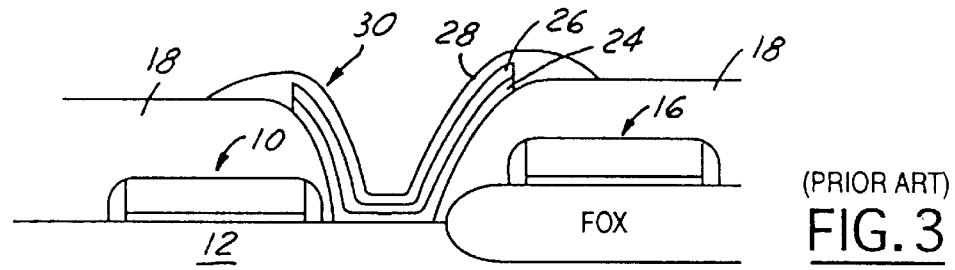
(PRIOR ART) FIG. 3
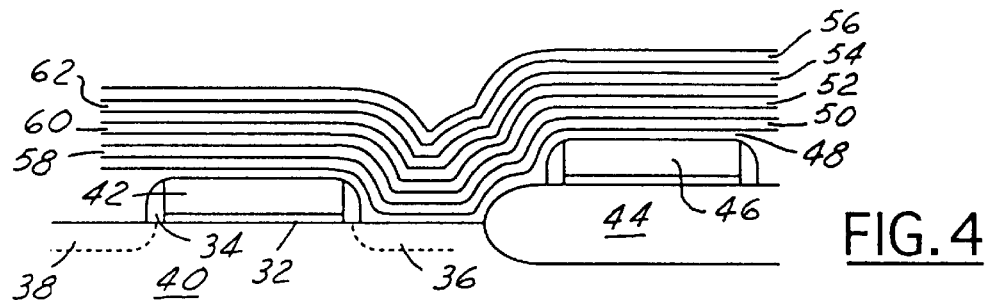
FIG. 4
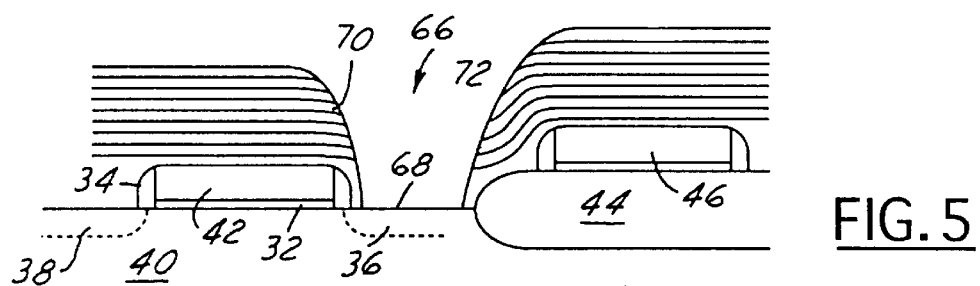
FIG. 5
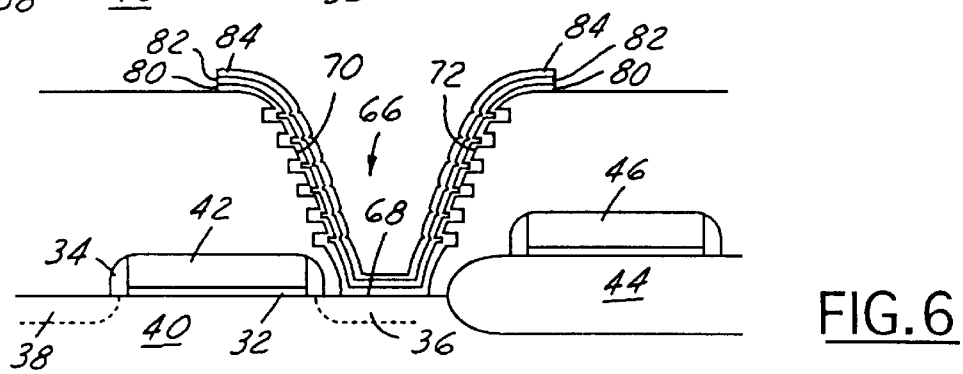
FIG. 6

METHOD OF FORMING STACKED CAPACITOR HAVING CORRUGATED SIDE-WALL STRUCTURE

FIELD OF THE INVENTION

The present invention generally relates to a stacked capacitor used in a dynamic random access memory (DRAM) device and more particularly, relates to a stacked capacitor in a DRAM device that has corrugated oxide spacer side-wall structure for improved capacitor charge storage.

BACKGROUND OF THE INVENTION

In DRAM devices, small dimension and high capacitance value per unit area of a capacitor are desirable for achieving high charge storage capacity. The capacitors are usually formed by at least two layers of polysilicon and one layer of a dielectric material. The polysilicon capacitors are widely used in DRAM applications which require a thin oxide layer to form an oxide sandwich between two polysilicon layers to produce a high capacitance capacitor cell.

In modern memory devices, while the dimensions of the device are continuously been miniaturized, methods for reducing the horizontal capacitor size become more critical. One such method proposed by others encompassing a design of stacking a capacitor over the bit line on the surface of a silicon substrate. The stacked capacitor is formed of a layer of dielectric material such as silicon oxide or oxide-nitride-oxide that is sandwiched between two layers of polysilicon. The effective capacitance of a stacked cell is increased over that of a convention planar cell due to its increased surface area. A conventional method of fabricating a stacked capacitor for DRAM is shown in FIGS. 1–3.

As shown in FIG. 1, a transistor 10 is first formed on a surface of the silicon substrate 12. A birds beak field oxide layer (FOX) 14 is also formed in the surface of the silicon substrate 12 that has a passing gate 16 formed on top of the field oxide isolation. A silicon nitride etch stop layer (not shown) is then blanket deposited on the surface.

In the next step of fabrication, as shown in FIG. 2, an oxide layer 18, or a cell contact non-doped silicate glass (CCNSG), is blanket deposited on the IC device. The CCNSG layer 18 is then patterned, photomasked and etched to form a cell contact hole 22. After the formation of the cell contact hole 22, a layer of polysilicon 24, a layer of dielectric material such as silicon oxide or oxide-nitride-oxide material 26 are deposited. This is shown in FIG. 3. After the two layers are patterned and etched by conventional processes to define the capacitor cell, a polysilicon layer 28 is deposited and then patterned and etched to define the capacitor cell 30.

In this method, even though the side-wall thickness of the capacitor cell 30 is increased by the addition of the CCNSG layer 18, the limiting factor for the increased capacitance of the cell is the height of the cell that is allowed.

It is therefore an object of the present invention to provide a capacitor cell in a DRAM device that has improved capacitance without significantly increase the cell height.

It is another object of the present invention to provide a capacitor cell in a DRAM device that does not require the deposit of a thick CCNSG layer to increase the side-wall thickness of the cell.

It is a further object of the present invention to provide a capacitor cell in a DRAM device that incorporates the deposition of a plurality of oxide layers in place of a single CCNSG layer while maintaining the total height of the cell.

It is still another object of the present invention to provide a capacitor cell in a DRAM device that has enhanced side-wall area by incorporating the deposition of a plurality of oxide layers wherein each layer is deposited by a different deposition technique than that used for depositing its immediate adjacent layers.

It is yet another object of the present invention to provide a capacitor cell for a DRAM device that has enhanced side-wall area by incorporating a plurality of oxide layers wherein each alternating layer is deposited by a different technique selected from a thermal chemical vapor deposition CVD technique and a plasma CVD technique.

It is still another object of the present invention to provide a capacitor cell in a DRAM device that has enhanced side-wall area built by incorporating a plurality of oxide layers wherein each layer has a density that is different than its immediately adjacent layers.

It is still another further object of the present invention to provide a capacitor cell in a DRAM device that has enhanced side-wall area by incorporating a plurality of oxide layers which can be etched by an etchant that has different etch selectivity for the different oxide layers.

It is yet another further object of the present invention to provide a capacitor cell in a DRAM device that has enhanced side-wall area by incorporating a plurality of oxide layers that produce a corrugated configuration in the side-wall after an etching process.

It is yet another further object of the present invention to provide a capacitor cell in a DRAM device that has enhanced side-wall area by incorporating a plurality of oxide layers wherein the layers are etched by an acid having an etch selectivity ratio of at least 1:4 for the different oxide layers.

SUMMARY OF THE INVENTION

The present invention provides a method of fabricating a capacitor cell for a DRAM device that has enhanced side-wall thickness and a corrugated configuration of the side-wall for maximizing the surface area in order to increase the capacitance of the capacitor cell while maintaining its vertical dimension. The present invention also provides a capacitor cell in a DRAM device fabricated from such method.

In the preferred embodiment, a semiconductor substrate is first provided and then a gate and an isolation are formed on the surface on the substrate. Next, a plurality of oxide layers are deposited overlying the gate and the isolation by a deposition method alternating between a thermal CVD method and a plasma CVD method for each of the layers, the plurality of oxide layers are then etched through to form a capacitor cell contact by a plasma etching technique, the plurality of oxide layers having a capacitor cell contact etched therein are then decoratively etched by an etchant that has sufficient etch selectivity difference between the thermal CVD formed and the plasma CVD formed oxide layers such that a corrugated edge is formed in the cell opening, and then depositing polysilicon and dielectric layers in the capacitor cell to form the capacitor.

The present invention also provides a capacitor in a DRAM device that has improved charge storage capacity including the components of a semiconductor substrate, a gate and an isolation on the surface of the substrate, a plurality of oxide layers overlying the gate and the isolation wherein each alternating layer has a density that is different than the density of its immediate adjacent layers, a capacitor cell contact formed in the plurality of oxide layers to expose the substrate wherein the plurality of oxide layers having edges exposed in the cell opening in a corrugated configuration, and at least two layers of a semiconducting material and a layer of a dielectric material deposited in the cell opening to form the capacitor.

BRIEF DESCRIPTION OF THE DRAWINGS

These and other objects, features and advantages of the present invention will become apparent from the following detailed description and the appended drawings in which:

FIG. 1 is an enlarged, cross-sectional view of a conventional transistor gate and an isolation on the surface of a substrate.

FIG. 2 is an enlarged, cross-sectional view of the conventional substrate shown in FIG. 1 having a layer of cell contact non-doped silicate glass deposited and patterned on top.

FIG. 3 is an enlarged, cross-sectional view of the conventional substrate shown in FIG. 2 having a capacitor formed in the cell contact.

FIG. 4 is an enlarged, cross-sectional view of the present invention substrate having a plurality of oxide layers deposited on top.

FIG. 5 is an enlarged, cross-sectional view of the present invention substrate shown in FIG. 4 having a contact cell formed on the substrate.

FIG. 6 is an enlarged, cross-sectional view of the present invention substrate having a multiplicity of oxide layers etched at different selectivities to form a corrugated surface configuration.

DETAILED DESCRIPTION OF THE PREFERRED EMBODIMENT

Increased capacitor charge storage is very important in future modem DRAM designs. One method to achieve the objective is to increase the area of the storage node without increasing the overall horizontal cell dimensions. The present invention provides a vertically corrugated side-wall structure of oxide spacer to enlarge the memory cell area. The fabrication method employs an alternating deposition of thermal CVD and plasma CVD oxide layers and selectively wet etch the layers.

In accordance with the present invention, a method of forming a capacitor having improved charge storage capability and a capacitor formed thereby are provided. Referring initially to FIG. 4, wherein a P type substrate 40 of a semiconducting material is shown. On the semiconducting substrate 40, a field oxide layer 44 is first formed to a thickness between about 3000 Å and about 5500 Å by a thermal oxidation process. The field oxide layer 44 is used to isolate the IC devices to be formed on substrate 40. A metal oxide FET (field effect transistor) consisting of a gate oxide layer 32, a gate electrode 42, side-wall spacers 34 and $N^+$ doped source 36/drain 38 are formed on the P type substrate 40. The gate oxide layer 32 is formed by a thermal oxidation process on the surface of substrate 40 to a thickness between about 50 Å and 200 Å. The gate electrode 42 is generally formed by a low pressure chemical vapor deposition (LPCVD) process wherein a polysilicon layer of about 1000~3000 Å thickness is first deposited followed by the deposition of an oxide layer (not shown) by another LPCVD process from a reactant gas mixture of TEOS, $N_2O$ and $O_2$. The oxide layer which has a thickness between about 500 Å and about 1200 Å is deposited at a reaction temperature of about 720° C. and a chamber pressure of about 250 mTorr. After the deposition of the oxide layer, the gate 42 is formed by photolithography and etching processes to etch away the unnecessary oxide and polysilicon. An ion implantation process utilizing phosphorus ions is then carried out to form the $N_-$ lightly doped source and drain regions (not shown).

In the next fabrication step, dielectric layer is deposited and etched by an isotropic etching process to form sidewall spacers 34 on the gate electrode 42. The dielectric layer is generally deposited of silicon dioxide by a LPCVD process with a reactant gas mixture of teltraethoxy silicate (TEOS), $N_2O$ and $O_2$. The thickness of the dielectric layer deposited is between about 500 Å and about 1500 Å. An ion implantation technique is then used to form $N^+$ heavily doped source 36/drain 38 regions with arsenic ions. The ion dosage is between about 1E15 and about 3E16 ions/cm$^2$ applied at an implantation energy of between about 30 teev and about 90 teev. The transistor structure is thus completed. A passing gate 46 is also formed on top of the field oxide layer 44.

As shown in FIGS. 1–3, in a conventional capacitor cell structure, a non-doped oxide is used as the cell contact hole side-wall material and for insulating from the silicon substrate. The present invention provides a method of depositing an oxide spacer on top of a conventionally deposited cell contact non-doped silicate glass (CCNSG) layer 48. A thin nitride etch-stop layer (not shown) is deposited prior to the deposition of the oxide spacer to protect the CCNSG layer during the oxide etching process.

The nitride etch-stop should be removed before the cell contact is formed. The oxide spacer is made up of a plurality of oxide layers that are deposited by alternating thermal CVD and plasma CVD methods.

As shown in FIG. 4, layers 50, 52, 54 and 56 are deposited by a thermal CVD method which can be conducted at a chamber temperature of 300° C. or higher. For instance, by the following reactions:

1. Cold wall or LPCVD method
   $SiH_4 + O_2 \rightarrow SiO_2 + 2H_2$
   Temperature: 300° C.~1000° C.
   Pressure: 0.03 τ~760 τ
2. APCVD (atmospheric pressure chemical vapor deposition) Method
   $SiH_4 + O_2 \rightarrow SiO_2 + 2H_2$
   Temperature≈400° C.
3. SACVD (sub-atmospheric pressure chemical vapor deposition) Method
   $SiH_4 + O_2 \rightarrow SiO_2 + 2H_2$
   Temperature ≈500° C.
4. TEOS Decomposition Method
   $Si(OC_2H_5)_4 \rightarrow SiO_2 + $ by product
   Temperature: 650° C.~700° C.
   Pressure: 1 τ~760 τ
5. Dichlorosilane Method
   $SiCl_2H_2 + 2N_2O \rightarrow SiO_2 + 2N_2 + 2HCl$
   Temperature: 900° C.
   Pressure: 1 τ~760 τ

The thickness for each individual layer is in the range between about 100 Å and about 500 Å.

Alternatingly, layers 58, 60 and 62 are deposited by a plasma CVD method wherein the deposition temperature is between 25° C. and 700° C. For instance, $SiH_4 + O_2 \rightarrow SiO_2$
Temperature: =300° C. in argon gas
Pressure=ambient
n=1.46

$SiH_4+N_2O \rightarrow SiO_2$
Temperature=380° C. in nirogen gas
Pressure=ambient
n=1.50

Pressure: 0.1~5 Torr

Temperature: 25° C.~700° C.

RF frequency: 25~450 kHz
13.56 MHz
27 MHz

RF power coupling capacitively or inductively.

The dielectric constant n ranges from 1.4~1.55.

It has also been discovered that TEOS oxide is not preferred in the present invention method. A suitable thickness for the individual layers of plasma CVD oxide is between about 100 Å and about 500 Å. The total thickness for all the oxide layers shown in FIG. 4 is in the range between about 1000 Å and about 5000 Å.

The thermal CVD deposition and the plasma CVD deposition of oxide layers can be conducted in a standard deposition chamber such as that made by Applied Materials, Inc. model P5000.

After the alternating layers of oxide are deposited, cell contact patterning and photolithographic processes are carried out on the top oxide layer 56. By utilizing a plasma etching (or reactive ion etching) technique which stops at the nitride etch-stop layer, a straight contact hole 66 is formed to expose a contact area 68 of silicon substrate. The side walls 70 and 72 of the contact hole are relatively smooth after the plasma etching process since the plasma has no selectivity between the oxide layers formed by the thermal CVD method and by the plasma CVD method.

In a subsequent hydrogen fluoride wet etch process (also called a HF wet decoration process), based on the different densities of the oxide layers formed by the thermal CVD method and by the plasma CVD method, the etch selectivity between thermal CVD and plasma CVD in an acid-based etchant such as hydrogen fluoride is approximately 1:4. As shown in FIG. 6, after a wet etching process is carried out in HF, the side-walls 70 and 72 of the contact hole 66 are etched into a corrugated configuration. The enchant HF has higher selectivity toward the oxide layers formed by the plasma CVD method and a lower selectivity toward the oxide layers formed by the thermal CVD method. It is believed that the densities of the two types of films formed are different by at least about 10%. As a result, the oxide layers formed by the plasma CVD method are etched less severely that the oxide layers formed by the thermal CVD method leading to a corrugated configuration of the side walls 70 and 72. This corrugated side-wall substantially increases the surface area available on the side-walls of the capacitor cell. The etch selectivity of the oxide layers can also be controlled by the processing parameters used in the deposition process. For instance, the gap (or the electrode spacing), the reactant gas pressure and the plasma power level can influence the properties of the oxide film obtained and consequently, its etch selectivity.

In a subsequent fabrication process, the nitride and CCNSG layers are etched away at the cell contact area. Node polysilicon (2P) of approximately 1000 Å~2000 Å thick is deposited and in-situ doped to form a node. After a 2P photolithography and a 2-P etch process, wet acid (hydrogen fluoride) is used to strip the oxide layer and stops at the nitride layer 80. A layer of thin rugged polysilicon is then deposited and in-situ doped with a thin dielectric layer 82 of oxide-nitride-oxide (or oxynitride) of approximately 30 Å~100 thickness deposited on top. In the last fabrication step, a P3 polysilicon layer 84 (or a capacitor plate layer) having a thickness of approximately 1500 Å~3000 Å is deposited on top to form the capacitor cell 66. A capacitor cell that has substantially improved charge storage capability is thus achieved by the present invention method.

It should be noted that hydrofluoric acid is illustrated as one example of the wet enchant that has the proper selectivity between the oxide layers prepared by the different techniques. Other etchants that perform similarly with suitable selectivity between the oxide layers may also be used to achieve the same desirable result achieved by hydrogen fluoride.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method of forming a capacitor having improved charge storage capability comprising the steps of:

providing a semiconductor substrate, forming a gate and an isolation on the surface of the substrate, depositing a plurality of oxide layers overlying the gate and the isolation by a deposition method alternating between thermal chemical vapor deposition (CVD) and plasma CVD, etching through said plurality of oxide layers to form a capacitor cell contact by a plasma etching technique, etching said plurality of oxide layers by an etchant having sufficient etch selectivity between thermal CVD and plasma CVD oxide layers such that a corrugated sidewall is formed in said capacitor cell after said etching step, and depositing semiconducting and insulating layers in said capacitor cell to form said capacitor.

2. A method according to claim 1, wherein said isolation formed is a local oxidation.

3. A method according to claim 1, wherein said plurality of oxide layers is at least two layers.

4. A method according to claim 3, wherein said plurality of oxide layers is between 2 and 20 layers.

5. A method according to claim 1, wherein said acid used in the etching comprises HF.

6. A method according to claim 1, wherein said plasma etching technique is selected from the group consisting of a magnetically enhanced reactive ion etching technique, an electron cyclotron resonance technique and a reactive ion etching technique.

7. A method according to claim 1, wherein said sufficient etch selectivity between said thermal CVD and said plasma CVD oxide layers is at least about 1:2.

8. A method according to claim 1, wherein said etchant is HF and said etch selectivity between said thermal CVD and said plasma CVD oxide layers is about 1:4.

9. A method according to claim 1, wherein said plurality of oxide layers has a total thickness between about 500 Å and about 5000 Å, preferably between about 1000 Å and about 3000 Å.

10. A method according to claim 1, wherein said plurality of oxide layers each having a thickness between about 100 Å and about 500 Å.

11. A method according to claim 1 further comprising the step of depositing a layer of cell contact non-doped silicate glass before the deposition step of said plurality of oxide layers.

12. A method of forming a capacitor having improved charge storage comprising the steps of:

providing a semiconductor substrate, forming a gate and an isolation on the surface of the substrate, blanket depositing a layer of a cell contact non-doped silicate glass, blanket depositing a plurality of oxide layers overlying said cell contact non-doped silicate glass layer by a deposition method alternating between a thermal CVD and a plasma CVD technique, etching through said plurality of oxide layers and said non-doped silicate glass layer to form a capacitor cell contact by a plasma etching technique, etching said plurality of oxide layers by an etchant having sufficient etch selectivity between thermal CVD and plasma CVD oxide layers such that a corrugated sidewall is formed in said capacitor cell after said etching step, and deposition semiconducting and dielectric layers in said capacitor cell to form said capacitor.

* * * * *